United States Patent [19]

Kato

[11] Patent Number: 5,724,056
[45] Date of Patent: Mar. 3, 1998

[54] METHOD FOR CONSTRUCTING A LIQUID CRYSTAL DISPLAY

[75] Inventor: Teruyuki Kato, Settsu, Japan

[73] Assignee: Kabushiki Kaisha Kato Seiko, Osaka, Japan

[21] Appl. No.: 537,632

[22] Filed: Oct. 2, 1995

Related U.S. Application Data

[63] Continuation of Ser. No. 300,041, Sep. 2, 1994, abandoned.

[51] Int. Cl.⁶ .................................................. G09G 3/36
[52] U.S. Cl. .................................... 345/87; 349/150
[58] Field of Search ........................ 359/88, 74; 345/205, 345/206, 87; 349/150, 58

[56] References Cited

U.S. PATENT DOCUMENTS 5,341,233  8/1994  Tomoike et al. ...................... 349/150

FOREIGN PATENT DOCUMENTS 4-183767  6/1992  Japan ................................ C09J 7/02

*Primary Examiner*—Curtis Kuntz
*Assistant Examiner*—Vivian Chang
*Attorney, Agent, or Firm*—Seed and Berry LLP

[57] ABSTRACT

The present invention relates to a method for constructing a liquid crystal display, including a first step for connecting a first end part of a TAB film provided with a chip such as an LSI and an IC to an end part of a liquid crystal panel, and a second step for connecting a second end part of the TAB film to an end part of a printed board using solders, the end part of the printed board being formed to have projecting portions. According to the present method, prior to the second step, a tape is prepared, whose long side is cut to have projecting portions corresponding to the projecting portions of the end part of the printed board. Then, adhesive materials are thinly and evenly applied to a rear surface of each projecting portion of the tape. Thereafter, the tape is attached to the printed board so that the projecting portions of the tape may coincide with the projecting portions of the printed board and the adhesive materials may be applied to prescribed portions of the printed board. Next, the tape is removed from the printed board, leaving the adhesive materials on the prescribed portions of the printed board. Finally, the TAB film is arranged so as to be temporarily fixed to the printed board via the adhesive materials before being soldered thereto.

5 Claims, 5 Drawing Sheets

METHOD FOR CONSTRUCTING A LIQUID CRYSTAL DISPLAY

CROSS-REFERENCE TO RELATED APPLICATION

This application is a continuation of U.S. patent application Ser. No. 08/300,041, filed Sep. 2, 1994, now abandoned.

BACKGROUND OF THE INVENTION

1. Field of the Invention

The present invention relates to a method for constructing a liquid crystal display, including a step for connecting a liquid crystal panel and a printed board to each other via a TAB (Tape Automated Bonding) film provided with a chip such as an LSI (Large-Scale Integrated Circuit) and an IC (Integrated Circuit). More specifically, the present invention relates to a method for constructing a liquid crystal display, including a step for temporarily mixing the TAB film and the printed board to each other and then soldering wirings formed on the TAB film to wirings formed on the printed board.

2. Description of the Prior Art

Conventionally, for constructing a liquid crystal display, a first end part of a TAB film provided with a chip such as an LSI and an IC is thermally compressed and bonded to an end part of a liquid crystal panel using anisotropic conductive adhesives; and a second end part to the TAB film is connected to an end part of a printed board using cream solders, the end part of the printed board being arranged at a prescribed distance from the end part of the liquid crystal panel. The TAB film is ordinary rolled in store, and is spread in use. Therefore, the second end part of the TAB film tends to remain curved, and the TAB film disadvantageously tends to become floating or warped during the cream soldering step. Thus, there is a problem in that the cream soldering step cannot be performed perfectly. In order to overcome the problem, according to one of conventional methods, as shown in FIG. 6, adhesives 9 are manually applied to several portions on a printed board 3 so as not to touch pattern wirings 4 formed on the printed board 3. With the adhesives 9, the printed board 3 and the second end part of the TAB film are temporarily adhered to each other, and then cream solders arranged on the printed board 3 are thermally melted so as to connect the second end part of the TAB film and the printed board 3 to each other.

However, it is difficult to manually apply adhesives 9 to desired portions of the printed board 3 evenly and accurately. Thus, according to the above-described method, there is a possibility that the adhesives will be wrongly adhered to the pattern wirings formed on the printed board, making the resulting liquid crystal display defective. Furthermore, the above method has another problem of poor work efficiency because of requiring skilled labor and a long work time.

To overcome the above problem, Japanese TOKKYO KOKAI No. 4-183767, which was made by the same inventor of the present application, proposed a novel method for constructing a liquid crystal display using a TAB film fixing tape in which adhesive materials are thinly and evenly applied at prescribed intervals on a thin mount. According to the method, the tape with the adhesive materials is applied to a printed board, and is removed from the printed board, leaving the adhesive materials on prescribed portions of the printed board. Then, the TAB film is arranged so that the adhesive materials may be applied to prescribed portions of the TAB film, herein, to portions between the chips and wirings with respect to the printed board, thereby temporarily fixing the TAB film to the printed board. Under such a condition, the above wirings of the TAB film are soldered to the wirings of the printed board.

However, the above-described method in which adhesives are manually applied and the method using the TAB film fixing tape are both required to form an adhesive part on the end part of the printed board, which necessitates an additional complicated step for positioning the adhesive part. Furthermore, the TAB film is required to have a space to be applied with adhesive materials between the chip and the wirings with respect to the printed board. Therefore, the TAB film is inevitably prolonged in the longitudinal direction. As a result, the liquid crystal panel and the printed board cannot be arranged close to each other, which prevents miniaturization of the liquid crystal display.

SUMMARY OF THE INVENTION

An object of the present invention is to provide a method for constructing a liquid crystal display, contributing to miniaturization of the resulting liquid crystal display by making it possible to closely arrange a liquid crystal panel and a printed board which are electrically connected via a TAB film.

Another object of the present invention is to provide a method for constructing a liquid crystal display, according to which adhesive materials to temporarily fix the TAB film to the printed board can be applied simply, thereby improving work efficiency.

Still another object of the present invention is to provide a method for constructing a liquid crystal display, according to which the adhesive materials can be applied to desired portions of the printed board accurately so as not to be brought into contact with pattern wirings of the printed board, thereby lessening the occurrence of defective goods.

Recently, to miniaturize a liquid crystal display, one side of a printed board has often made to have a square wave shape. The present inventor utilizes such tendency to achieve the above objects. That is, the method of the present invention employs a TAB film fixing tape provided with adhesive materials; and one of two long sides of the tape is cut in a square wave shape corresponding to the square wave shape of the side of the printed board. By coinciding the square wave of the TAB film fixing tape with the square wave of the printed board, it is possible to readily align the tape with the printed board and to accurately apply the adhesive materials of the tape to desired portions of the printed board.

Alternatively, the adhesive materials may be previously applied to prescribed portions of the TAB film with respect to the printed board in order to simply and accurately apply the adhesive materials to the printed board.

The above and further objects, features and advantages of the invention will more fully appear from the following description with reference to the accompanying drawings. It is to be expressly understood, however, that the drawings are for purpose of illustration only and are not intended as a definition of the limits of the invention.

DETAILED DESCRIPTION OF THE PREFERRED EMBODIMENTS

Hereinafter, the present invention will be described in more detail by way of illustrating examples with reference to Figures.

EXAMPLE 1

Figure 1:
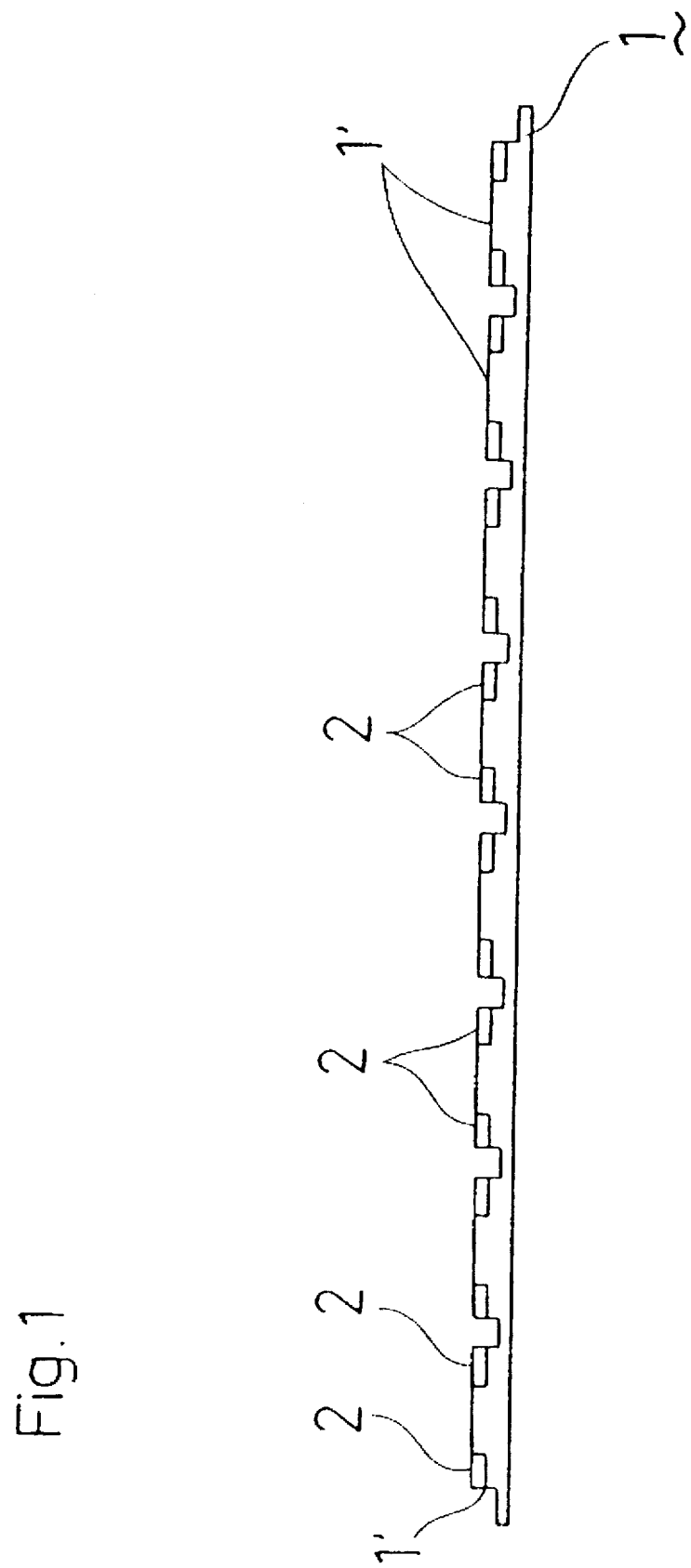
FIG. 1 is an exemplary back view of a tape according to the present invention.

FIG. 1 shows a tape 1 to be used in a first example of the present invention. As is shown in FIG. 1, one side of the tape is cut in a square wave shape to have projecting portions 1'. Each end of a rear surface of each projecting portion 1' is provided with an adhesive material 2. As a material for such a tape, any ordinary released paper may be employed. To make it easy to handle, however, the tape is desired to be formed of a relatively harder material. Furthermore, in order to readily confirm the presence of the adhesive materials 2 attached on the rear surface of the tape 1, it is preferable to employ a transparent synthetic resin material for the tape 1 and color the adhesive materials 2.

Figure 2:
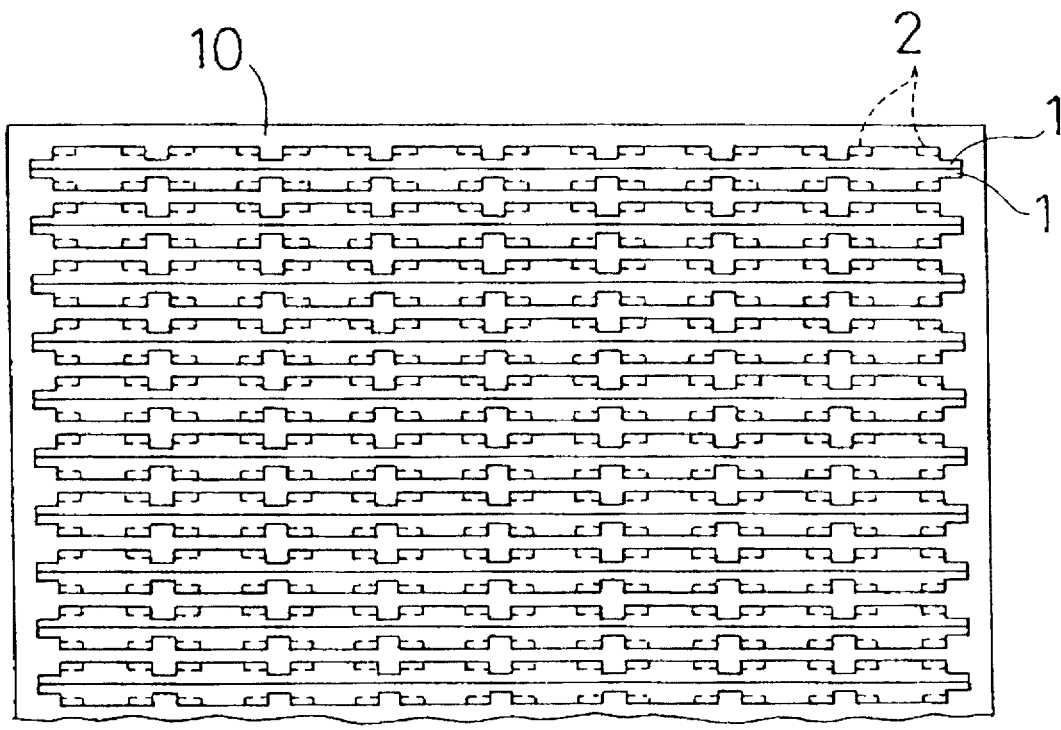
FIG. 2 is an exemplary plan view of tapes attached on a released paper before use according to the present invention.

FIG. 2 shows a plurality of tapes 1 parallel attached on a released paper 10. Each tape 1 with the adhesive materials 2 is attached on the released paper 10 so as to be readily peeled therefrom. For use, the tape 1 is peeled from the released paper 10 together with the adhesive materials 2.

Figure 3:
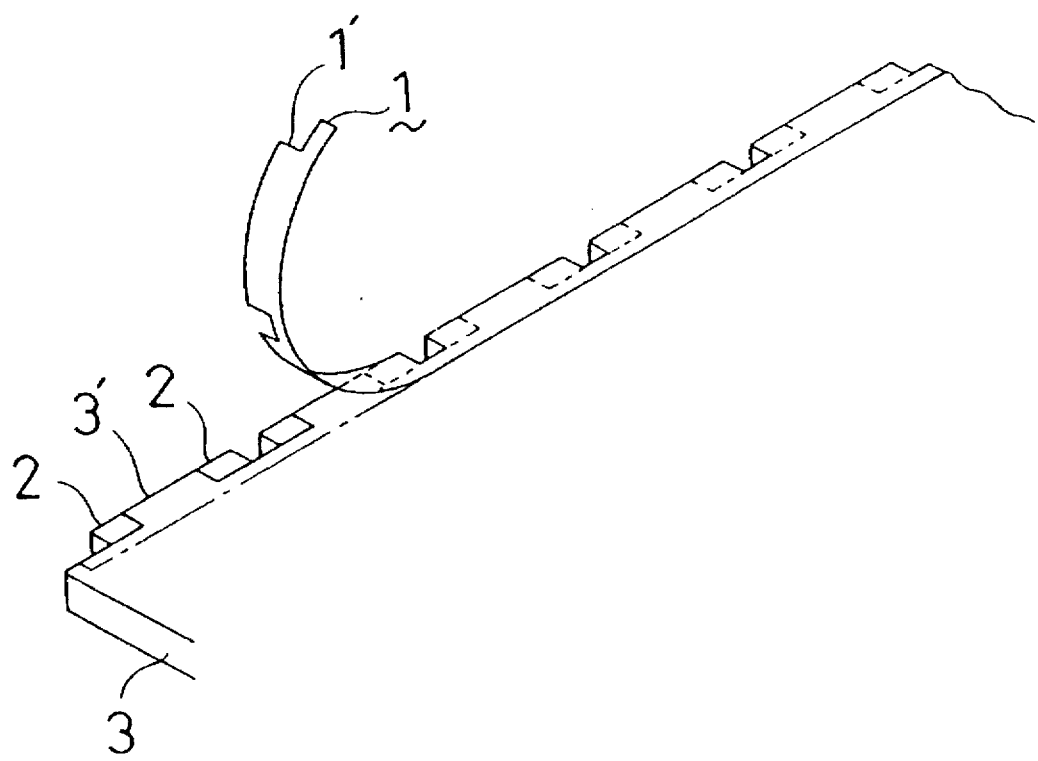
FIG. 3 is a cut away perspective view exemplarily illustrating a step for applying the tape to a printed board according to the present invention.

FIG. 3 is a cut away perspective view illustrating a condition where the thus peeled tape 1 provided with the adhesive materials 2 on the rear surface thereof is applied to a printed board 3. As shown in FIG. 3, one side of the printed board 3 is formed in a square wave shape so as to have projecting portions 3'; and the tape 1 is applied to the side of the printed board 3 so that the square wave shape of the tape 1 may coincide with the square wave shape of the side of the printed board 3. After the tape 1 is thus applied to the printed board 3, the tape 1 is removed. When the tape 1 is removed from the printed board 3, the adhesive materials 2 adhered on the rear surface of the projecting portion 1' are left on predetermined portions of the printed board 3, since the adhesive materials 2 are naturally adhered to the printed board 3 stronger than to the tape 1. Consequently, the adhesive materials 2 can be accurately adhered to the projecting portion 3' of the printed board 3.

Figure 4:
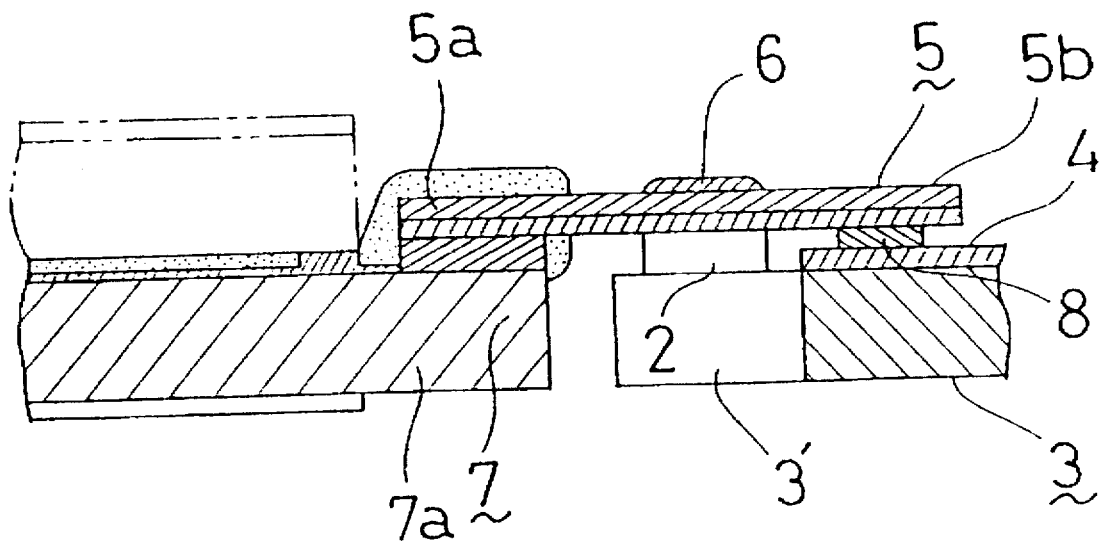
FIG. 4 is a cut away cross-sectional view exemplarily illustrating a condition where a liquid crystal panel and the printed board are connected to each other via a TAB film according to the present invention.
Figure 5:
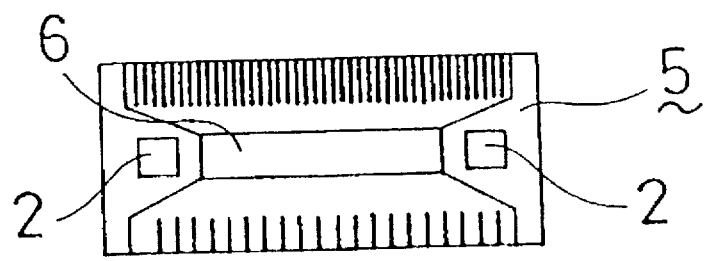
FIG. 5 is an exemplary plan view of a TAB film according to the present invention.
Figure 6:
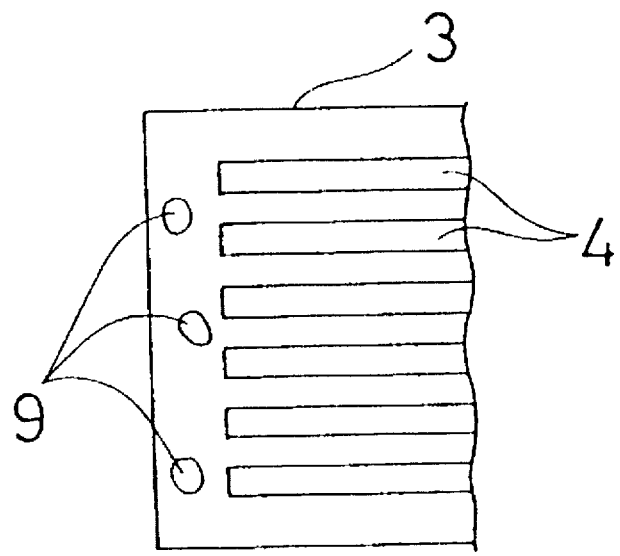
FIG. 6 is a plan view of a printed board to which adhesive materials are conventionally applied.

Thereafter, a TAB film 5 provided with a chip 6 is arranged so as to be temporarily fixed to the printed board 3 via the adhesive materials 2 as shown in FIG. 4. A first end part 5a of the TAB film 5 is previously connected to an end part 7a of a liquid crystal panel 7 using anisotropic conductive adhesives. Then, a second end part 5b of the TAB film 5 is to be connected to pattern wirings 4 formed on the printed board 3 using cream solders 8. According to the present invention, in order to perform the soldering step accurately, the adhesive materials 2 are previously applied to either end of the projecting portion 3' of the printed board 3 so that the TAB film 5 may be temporarily fixed to the printed board 3 at either outer side of the chip 6 as shown in FIG. 5. With such a configuration, the liquid crystal panel 7 and the printed board 3 which are connected via the TAB film 5 can be arranged close to each other as shown in FIG. 4.

In the present example, considering the thickness of the chip 6 such as an LSI and an IC mounted on the TAB film, the adhesive materials 2 are provided at either side of the rear surface of the projecting portion 1' so as not to be brought into contact with the chip 6. However, in a case where the rear surface (contacting surface) of the TAB film 5 is made flat, the adhesive materials 2 may be applied to the overall rear surface of the projecting portion 1'. By thus applying the adhesive materials 2 to the overall rear surface of the projecting portion 1', the TAB film 5 can be temporarily fixed to the printed board 3 much more accurately and strongly. In addition, the present invention can also be applied to a conventional TAB film having an adhesive part between a chip and wirings by means of applying the adhesive materials to the overall adhesive part. Alternatively, only the portions where the adhesive materials 2 are applied (in the first example, only the either side of the projecting portion 1') may be made projected. It is needless to say that the projecting portion 1' of the tape 1 is not limited to the shape of square shown in Figures, but it may have any desired shape. Furthermore, the projecting portions 1' of the tape 1 may be arranged at any desired regular or irregular intervals.

As is described above, the TAB film is temporarily adhered and fixed to the printed board at either outer side area of the chip mounted on the TAB film, which have not been utilized conventionally. By utilizing such a dead space, it becomes possible to use what is called a SLIM TAB film, which is shortened in the longitudinal direction. Thus, according to the present invention, the liquid crystal panel and the printed board can be closely arranged and connected via the SLIM TAB film, thereby contributing to miniaturization of the liquid crystal display.

EXAMPLE 2

In the first example, the adhesive materials 2 are applied to the prescribed portions of the printed board 3 using the tape 1 whose side is cut to have projecting portions 1', and thus the TAB film 5 can be temporarily fixed to the printed board 3 prior to the soldering step.

Hereinafter, a second example of the present invention, where adhesive materials 2 are applied not to a printed board 3 but to a TAB film 5 will be described with reference to FIGS. 4 and 5.

According to the second example, before the TAB film 5 is cut in a prescribed shape, two pieces of tapes provided with adhesive materials at prescribed intervals are parallel attached to either outer side of a chip 6 on the TAB film 5, respectively. Then, the band-like TAB film 5 is cut out together with the two pieces of tapes. Alternatively, the adhesive materials with a released paper may be applied to either outer side of the chip 6 during the TAB film cutting out process. For making it easy to automatically construct a liquid crystal display, the TAB film is desired to be applied with adhesive materials before being connected to the liquid crystal panel.

Next, a first end part 5a of the thus formed TAB film 5 is thermally compressed and bonded to an end part 7a of a liquid crystal panel 7 using anisotropic conductive adhesives. Thereafter, the released paper (not shown) is peeled from the TAB film 5 to expose the adhesive materials 2, and the printed board 3 is attached to the TAB film 5 so that the TAB film 5 can be temporarily fixed to a prescribed portion of the printed board 3 via adhesive materials 2. Under such a condition, wirings (not shown) formed on a second end part 5b of the TAB film 5 is connected to pattern wirings 4 formed on the printed board 3 via cream solders 8 as shown in FIG. 4.

As is described above, according to the second example, a liquid crystal display can be constructed simply without requiring a step for attaching the tape, thereby improving work efficiency much more.

As is described above, according to the method of the present invention, the both outer side areas of the chip on the TAB film, which have not conventionally been utilized, are utilized as adhesive areas for temporarily connecting to the printed board prior to the soldering step. Therefore, the TAB film can be made shorter without raising a possibility that the adhesive materials will be brought into contact with the wirings of the TAB film. As a result, the liquid crystal panel and the printed board can be closely arranged without adversely electing the work efficiency nor the manufacturing yield. Thus, the method of the present invention can contribute to miniaturization of the liquid crystal display to be used for a personal computer, a word processor, a television, or the other liquid crystal unit.

In addition, the thus constructed liquid crystal display, in which the TAB film is adhered to the printed board before being soldered thereto, is much more improved in strength compared with a conventional liquid crystal display in which the TAB film is connected to the printed board only via solders. Therefore, the liquid crystal display constructed by the method of the present invention has less possibility that the TAB film will wrongly be disconnected from the printed board, thereby improving durability and reliability of the finished liquid crystal display.

Various other modifications will be apparent to and can be readily made by those skilled in the art without departing from the scope and spirit of the present invention. The scope of the present invention is therefore to be limited only by the claims appended hereto.

What is claimed is:

1. A method for constructing a liquid crystal display, comprising a first step for connecting a first end part of a TAB film provided with a chip to an end part of a liquid crystal panel, and a second step for connecting a second end part of the TAB film to an end part of a printed board using solders, the end part of the printed board being formed to have projecting portions;

the method further comprising the following steps prior to the second step:

preparing a tape having a long side that is cut to have projecting portions corresponding to the projecting portions of the end part of the printed board, and applying adhesive materials to a rear surface of each projecting portion of the tape;

aligning the tape to the printed board using the projecting a portions on the tape as guides such that the projecting portions of the tape coincide with the projecting portions of the printed board so as to avoid contacting pattern wirings formed on the printed board;

attaching the tape to the printed board so that the projecting portions of the tape coincide with the projecting portions of the printed board and the adhesive are applied to prescribed portions of the printed board;

removing the tape from the printed board so as to leave the adhesive materials on the prescribed portions of the printed board; and arranging the TAB film so as to be temporarily fixed to the printed board via the adhesive materials so that the solders may be applied.

2. A method for constructing a liquid crystal display, according to claim 1, wherein the adhesive materials are applied to either end of a rear surface of each projecting portion of the tape.

3. A method for constructing a liquid crystal display, according to claim 1, wherein the adhesive materials are applied to the overall rear surface of each projecting portion of the tape.

4. The method of claim 1, wherein the TAB film is a SLIM TAB film that is longitudinally shortened.

5. A method for constructing a liquid crystal display having a printed circuit board having pattern wirings and a liquid crystal display panel with an attached TAB film with an end that is secured to the liquid crystal display panel and an unsecured end, comprising the steps of:

applying a tape to the TAB film, the tap having adhesive secured to it;

cutting the tape and TAB film on the unsecured end to have a shape that matches a shape of a target end of the printed circuit board;

removing the tape from the TAB film such that the adhesive remains secured to the TAB film;

aligning the cut portions of the unsecured end of the TAB film to the printed board using the cut portions of the unsecured end of the TAB film as guides such that the cut portions of the TAB film coincide with the printed board so as to avoid contacting the pattern wirings formed on the printed board; and temporarily securing the unsecured end of the TAB film to the target end of the printed circuit board via the adhesive on the TAB film so that the unsecured end of the TAB film may be permanently secured to the end of the printed circuit board.

* * * * *